(12) United States Patent
Sun et al.

(10) Patent No.: US 11,374,033 B2
(45) Date of Patent: Jun. 28, 2022

(54) THIN FILM TRANSISTOR, MANUFACTURING METHOD THEREOF, ARRAY SUBSTRATE AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Xuefeng Sun, Beijing (CN); Guoliang Liu, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/710,100

(22) Filed: Dec. 11, 2019

(65) Prior Publication Data

US 2020/0251501 A1 Aug. 6, 2020

(30) Foreign Application Priority Data

Jan. 31, 2019 (CN) .......................... 201910098426.8

(51) Int. Cl.
*H01L 27/12* (2006.01)
*H01L 29/66* (2006.01)
*H01L 29/786* (2006.01)

(52) U.S. Cl.
CPC ........ *H01L 27/124* (2013.01); *H01L 27/1222* (2013.01); *H01L 27/1262* (2013.01); *H01L 29/6675* (2013.01); *H01L 29/78672* (2013.01)

(58) Field of Classification Search
CPC .............. H01L 27/124; H01L 29/6675; H01L 27/1262; H01L 27/1222; H01L 29/78672;
(Continued)

(56) References Cited

U.S. PATENT DOCUMENTS

2007/0246707 A1 10/2007 Deng et al.
2007/0272926 A1 11/2007 Deng et al.
(Continued)

FOREIGN PATENT DOCUMENTS

CN 101127357 A 2/2008
CN 101149546 A 3/2008
(Continued)

OTHER PUBLICATIONS

Office action from Chinese Application No. 201910098426.8 dated Jun. 30, 2021.

*Primary Examiner* — Mohammed R Alam
(74) *Attorney, Agent, or Firm* — Calfee, Halter & Griswold LLP

(57) ABSTRACT

A thin film transistor, method of manufacturing the thin film transistor, an array substrate comprising the thin film transistor, and a display device comprising the array substrate. The thin film transistor comprises a substrate; a first electrode on the substrate; an active layer on a side of the first electrode away from the substrate; and a second electrode on a side of the active layer away from the first electrode. The first electrode and the second electrode are connected to the active layer, respectively. are also disclosed.

18 Claims, 3 Drawing Sheets

(58) Field of Classification Search
CPC ......... H01L 29/78675; H01L 29/66757; H01L 29/78696; H01L 29/41791
See application file for complete search history.

(56) References Cited

U.S. PATENT DOCUMENTS

| | | | |
|---|---|---|---|
| 2015/0243722 A1* | 8/2015 | Kwon | H01L 27/3272 257/40 |
| 2016/0049426 A1 | 2/2016 | Jungshik | |
| 2017/0090229 A1 | 3/2017 | Hajime | |
| 2018/0151654 A1* | 5/2018 | Lee | H01L 27/3272 |
| 2018/0190744 A1 | 7/2018 | Oh et al. | |
| 2019/0013409 A1 | 1/2019 | Li et al. | |
| 2019/0123156 A1 | 4/2019 | Wu et al. | |
| 2020/0052129 A1* | 2/2020 | Miyake | H01L 27/1225 |

FOREIGN PATENT DOCUMENTS

| | | |
|---|---|---|
| CN | 106531692 | 3/2017 |
| CN | 107845676 | 3/2018 |
| CN | 108281430 | 7/2018 |

* cited by examiner

THIN FILM TRANSISTOR, MANUFACTURING METHOD THEREOF, ARRAY SUBSTRATE AND DISPLAY DEVICE

RELATED APPLICATION

The present application claims the benefit of Chinese Patent Application No. 201910098426.8, filed on Jan. 31, 2019, the entire disclosure of which is incorporated herein by reference.

FIELD

The present disclosure relates to the field of electronic display technology, and specifically to a thin film transistor, a manufacturing method thereof, an array substrate, and a display device.

BACKGROUND

With the development of display technology, liquid crystal displays (LCDs) and organic light emitting displays (OLEDs) have been widely used in daily life, for example, for mobile phone screens, laptop display screens, desktop computer display screens, flat panel televisions, and the like. In the display devices described above, a thin film transistor (TFT) is generally used as a switching element to control switching of a pixel or as a driving element to drive a pixel. Thin film transistors are generally classified into amorphous silicon (a-Si) thin film transistors and polysilicon (p-Si) thin film transistors in terms of the properties of a silicon thin film (i.e. active layer). Compared with amorphous silicon thin film transistors, polysilicon thin film transistors have higher electron mobility, better liquid crystal characteristics, and lower leakage current. Therefore, polysilicon thin film transistors, especially low temperature polysilicon (LTPS) thin film transistors, have become the target of a high level of interest in the display field.

A liquid crystal display panel typically comprises a color filter substrate, an array substrate (including a plurality of thin film transistors arranged in an array), and a liquid crystal layer sandwiched therebetween. The general operating principle of a liquid crystal display panel is to control the deflection of liquid crystal molecules in the liquid crystal layer by applying an electric field to the liquid crystal layer to thereby adjust light emitted by a backlight module to generate different images. Since the low temperature polysilicon is sensitive to illumination, when it is used in a liquid crystal display panel, a photo-generated leakage current will be generated in the thin film transistor under backlight illumination, and the photo-generated leakage current will affect an effective control over the liquid crystal molecules, thereby affecting the displayed image. Therefore, a polysilicon array substrate currently used for a liquid crystal display panel generally further comprises a light shielding structure to prevent backlight from illuminating the low temperature polysilicon material in the active layer, thereby suppressing the generation of the photo-generated leakage current.

SUMMARY

An exemplary embodiment provides a thin film transistor comprising: a substrate; a first electrode on the substrate; an active layer on a side of the first electrode away from the substrate; and a second electrode on a side of the active layer away from the first electrode, wherein the first electrode and the second electrode are electrically connected to the active layer, respectively.

According to some exemplary embodiments, the above thin film transistor further comprises: a buffer layer between the first electrode and the substrate; and an insulating layer between the active layer and the second electrode, wherein the active layer is electrically connected to the first electrode through a first via in the buffer layer, and the active layer is electrically connected to the second electrode through a second via in the insulating layer.

According to some exemplary embodiments, the active layer comprises a low temperature polysilicon material, the first electrode comprises a light shielding material, and an orthographic projection of the first electrode on the substrate at least partially overlaps an orthographic projection of the active layer on the substrate.

According to some exemplary embodiments, the orthographic projection of the active layer on the substrate has area larger than that of the orthographic projection of the first electrode on the substrate.

According to some exemplary embodiments, the insulating layer comprises a gate insulating layer on a side of the active layer away from the buffer layer, and an interlayer insulating layer on a side of the gate insulating layer away from the active layer, the thin film transistor further comprises a gate between the interlayer insulating layer and the gate insulating layer.

According to some exemplary embodiments, the second electrode is in unity with a material filling the second via.

According to some exemplary embodiments, the first via and the second via have equal depths in a direction perpendicular to the substrate, both of the first via and the second via penetrate through the interlayer insulating layer, the gate insulating layer and the active layer, and extend to a surface of the first electrode away from the substrate, wherein an orthographic projection of the first electrode on the substrate does not overlap an orthographic projection of the second electrode on the substrate, and wherein an orthographic projection of the first via on the substrate, and an orthographic projection of the second via on the substrate do not overlap an orthographic projection of the gate on the substrate.

Another exemplary embodiment provides a method of manufacturing a thin film transistor, comprising: forming a first electrode on a substrate; forming an active layer on a side of the first electrode away from the substrate; and forming a second electrode on a side of the active layer away from the first electrode, wherein the first electrode and the second electrode are electrically connected to the active layer, respectively.

According to some exemplary embodiments, the above method further comprises: forming a buffer layer between the first electrode and the substrate; forming a first via in the buffer layer to electrically connect the active layer and the first electrode; forming an insulating layer between the active layer and the second electrode; and forming a second via in the insulating layer to electrically connect the active layer and the second electrode.

According to some exemplary embodiments, the active layer is fabricated using a low temperature polysilicon material, the first electrode is fabricated using a light shielding material, and an orthographic projection of the first electrode on the substrate at least partially overlaps an orthographic projection of the active layer on the substrate.

According to some exemplary embodiments, the second electrode and a conductive material filling the second via are simultaneously formed in a single patterning process.

According to some exemplary embodiments, forming the insulating layer comprises forming a gate insulating layer on a side of the active layer away from the buffer layer, and forming an interlayer insulating layer on a side of the gate insulating layer away from the active layer, and the method further comprises: forming a gate between the interlayer insulating layer and the gate insulating layer.

According to some exemplary embodiments, the first via and the second via are formed simultaneously so that the first via and the second via have equal depths in a direction perpendicular to the substrate, both of the first via and the second via penetrate through the interlayer insulating layer, the gate insulating layer and the active layer, and extend to a surface of the first electrode away from the substrate, wherein an orthographic projection of the first electrode on the substrate does not overlap an orthographic projection of the second electrode on the substrate, and wherein an orthographic projection of the first via on the substrate, and an orthographic projection of the second via on the substrate do not overlap an orthographic projection of the gate on the substrate.

According to some exemplary embodiments, the second electrode and a conductive material filling the first via and the second via are simultaneously formed in a single patterning process.

Another exemplary embodiment provides an array substrate comprising any of the thin film transistors described above.

According to some exemplary embodiments, the above array substrate further comprises a data line in a same layer as the second electrode.

According to some exemplary embodiments, the thin film transistor further comprises: a buffer layer between the first electrode and the substrate; and an insulating layer between the active layer and the second electrode, wherein the active layer is connected to the first electrode through a first via in the buffer layer, and the active layer is connected to the second electrode through a second via in the insulating layer.

According to some exemplary embodiments, the active layer comprises a low temperature polysilicon material, the first electrode comprises a light shielding material, and an orthographic projection of the first electrode on the substrate at least partially overlaps an orthographic projection of the active layer on the substrate.

According to some exemplary embodiments, the orthographic projection of the active layer on the substrate has area larger than that of the orthographic projection of the first electrode on the substrate.

Yet another exemplary embodiment provides a display device comprising any of the array substrates described above.

BRIEF DESCRIPTION OF THE DRAWINGS

The above and/or additional aspects of the present disclosure will become apparent and readily understood from the following description of exemplary embodiments in conjunction with the accompanying drawings, wherein.

DETAILED DESCRIPTION

Figure 1:
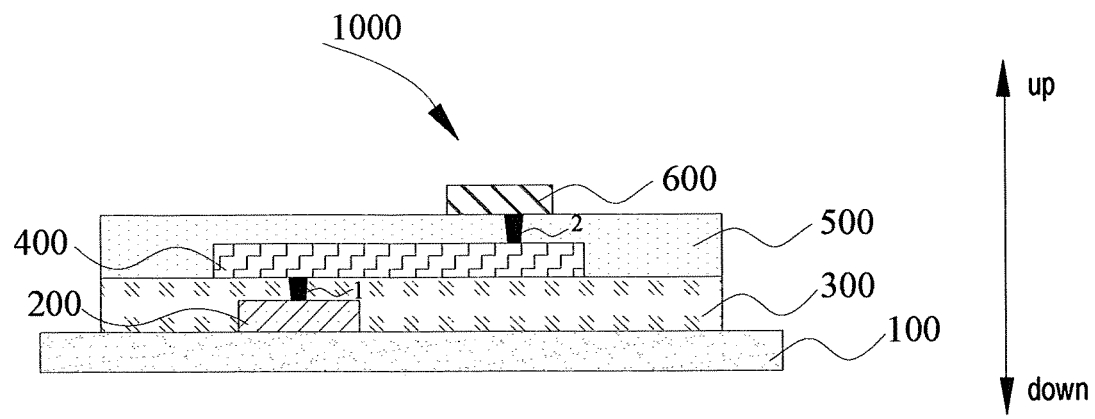
FIG. 1 illustrates a schematic structural view of a thin film transistor according to an exemplary embodiment.

Exemplary embodiments are described in detail below, and the exemplary embodiments are illustrated in the drawings, wherein the same or similar reference numerals denote the same or similar elements or elements having the same or similar functions throughout the description. The embodiments described below with reference to the accompanying drawings are exemplary, which are only intended to illustrate the present disclosure and are not to be construed as limiting the present disclosure.

Inventors of the present disclosure have found through research that current thin film transistors, especially low temperature polysilicon thin film transistors used for liquid crystal display panels, have problems such as a complicated manufacturing process, display panels that are prone to defects such as squares, bright spots, having a high production cost, and the like. In known methods of manufacturing a low temperature polysilicon array substrate, a light shielding structure is generally formed on a substrate, and a thin film transistor (TFT) structure is then formed (including, for example, forming an active layer, a gate layer, a source/drain layer, etc.) on a side of the light shielding structure away from the substrate. In the formed thin film transistor structure, the source and the drain are usually disposed in the same layer, that is, the source and the drain are formed by a single patterning process. The low temperature polysilicon array substrate further comprises a data line (including, for example, a touch electrode data line (TPM line), etc.) connected to an external driving circuit. The data line, the source and the drain of the thin film transistor are formed by a single patterning process. The inventors have found through extensive experiments and in-depth research that in such cases wherein the source, the drain, and the data line are formed by a single patterning process, the process requires a large area to be etched and high etching precision. The process also generates a lot of etching residues after etching. When the thin film transistor is used in a display product later, the etching residues result in occurrence of display defects such as squares (the etching residues between the data line, and the source and the drain are likely to form squares), bright spots (the etching residues between the source and the drain are likely to form bright spots), and the like, which in turn affects the product yield and use performance of the low temperature polysilicon thin film transistor.

Figure 7:
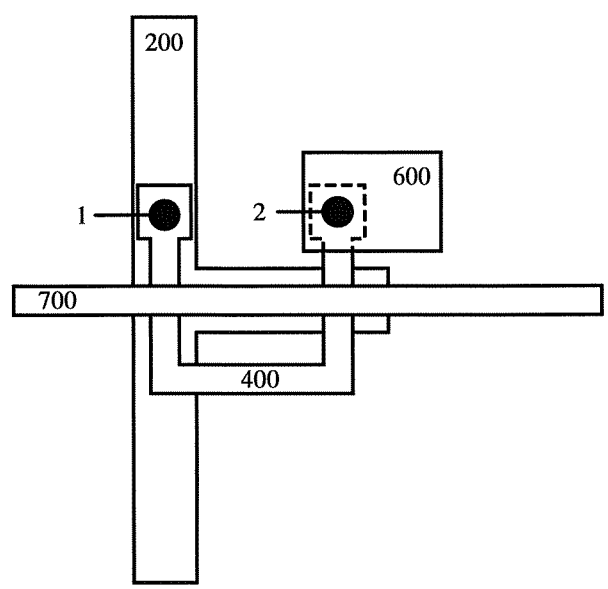
FIG. 7 illustrates a top view of a thin film transistor according to an exemplary embodiment.

In view of this, in an aspect of the present disclosure, a thin film transistor is provided. According to an exemplary embodiment, as shown in FIG. 1, a thin film transistor 1000 comprises a substrate 100, a first electrode 200, an optional buffer layer 300, an active layer 400, an optional insulating layer 500, and a second electrode 600. The first electrode 200 is located on the substrate 100, the buffer layer 300 is located on a side of the first electrode 200 away from the substrate 100, the active layer 400 is located on a side of the buffer layer 300 away from the first electrode 200, the insulating layer 500 is located on a side of the active layer 400 away from the buffer layer 300, and the second electrode 600 is located on a side of the insulating layer 500 away from the active layer 400. In an exemplary embodiment, the first electrode 200 and the active layer 400 may be connected through a first via 1 in the buffer layer 300. In an exemplary embodiment, an orthographic projection of the second electrode 600 on the substrate 100 at least partially overlaps an orthographic projection of the active layer 400 on the substrate 100, as shown in FIG. 7, and the second electrode 600 and the active layer 400 are connected through a second via 2 in the insulating layer 500. In this exemplary embodiment, the first electrode is one of a source and a drain of the thin film transistor, and the second electrode is the other of the source and the drain.

In the thin film transistor 1000 shown in FIG. 1, the first electrode 200 and the second electrode 600 are layered, so that etching residues generated when the first electrode 200 and the second electrode 600 are formed can be reduced, which can reduce or even avoid the occurrence of display defects such as squares, bright spots, etc. Moreover, in case the thin film transistor is a low temperature polysilicon thin film transistor (i.e., low temperature polysilicon is used to fabricate the active layer 400 of the thin film transistor), the orthographic projection of the active layer 400 on the substrate 100 at least partially overlaps that of the first electrode 200 on the substrate 100, as shown in FIG. 7, and the first electrode 200 includes a light shielding material. In this case, the first electrode 200 can be used not only as an electrode but also as a light shielding layer to suppress generation of a leakage current, which can reduce the production cost. Therefore, the low temperature polysilicon thin film transistor has a low production cost, a high process yield, good use performance, and does not increase the complexity of the production process.

As described above, in the current method of manufacturing a low temperature polysilicon array substrate, it is required to fabricate a dedicated light shielding structure, and to form the source and the drain by a single patterning process. In methods in which the source and the drain are formed by a single patterning process, it requires a large area of metal to be etched and high etching precision. Moreover, since two electrodes (the source and the drain) and metal traces need to be formed simultaneously in the same layer of the thin film transistor, more etching residues are generated after etching. As a result, when the thin film transistor is used in a display product later, the etching residues will lead to display defects such as squares, bright spots, and the like, which in turn affects the product yield and use performance of the low temperature polysilicon thin film transistor. In contrast, in the low temperature polysilicon thin film transistor according to an exemplary embodiment, by layering the first electrode and the second electrode (i.e., the source and the drain), it is possible to reduce the area that needs to be etched when the first electrode and the second electrode are fabricated separately and as a result, decrease the requirement on the etching precision, while generating fewer etching residues. This can reduce or even avoid display defects such as squares, bright spots, etc. caused by the etching residues, and improve the process yield and use performance of the product. On the other hand, the first electrode can not only function as an electrode, but also play the role of shielding light without disposing an additional light shielding layer, thereby preventing the polysilicon in the active layer from generating a leakage current under illumination. In the above embodiment, after the first electrode is disposed between the substrate and the buffer layer, it may be connected to the active layer through the first via, thereby not affecting the electrode performance of the first electrode. Therefore, the low temperature polysilicon thin film transistor according to an exemplary embodiment has good use performance (fewer display defects such as squares, bright spots, etc.), and a low production cost due to omission of the process for fabricating a separate light shielding layer.

Further, in an exemplary embodiment, the second electrode and a material filling the second via may be formed in unity, wherein the second via is filled with a conductive material the same as the second electrode in order to simplify the manufacturing process for the thin film transistor, and reduce the manufacturing cost.

Figure 2:
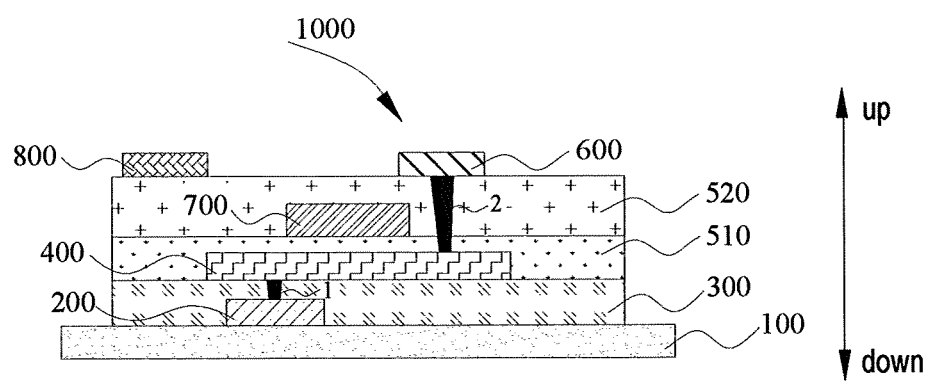
FIG. 2 illustrates a schematic structural view of a thin film transistor according to another exemplary embodiment.

It will be understood by those skilled in the art that the thin film transistor according to an exemplary embodiment further comprises other structures such as a gate, a gate insulating layer, an interlayer insulating layer, and the like. According to an exemplary embodiment, as shown in FIG. 2, the insulating layer 500 comprises a gate insulating layer 510 and an interlayer insulating layer 520, wherein the gate insulating layer 510 is located on a side of the active layer 400 away from the buffer layer 300, a gate 700 is located on a side of the gate insulating layer 510 away from the active layer 400, and the interlayer insulating layer 520 is located on a side of the gate 700 away from the gate insulating layer 510.

According to an exemplary embodiment, the specific type of the substrate 100 is not particularly limited, and it may be an insulating substrate such as glass or the like. According to an exemplary embodiment, the materials for forming the first electrode 200, the gate 700 and the second electrode 600, and the structures thereof are not particularly limited, which may be, for example, a metal material including at least one of Al, Cu, Mo, Ti and AlNd. By way of example, the first electrode 200, the gate 700, and the second electrode 600 may be a single-layer metal film of Al, Cu, Mo, Ti, AlNd, or the like, or may be a multilayer metal film of Mo/Al/Mo, Ti/Al/Ti, or the like. The first electrode 200 formed of a metal material can serve as a light shielding layer having a good light shielding effect, so that generation of a leakage current can be suppressed. According to an exemplary embodiment, the materials for forming the buffer layer 300, the gate insulating layer 510, and the interlayer insulating layer 520 are not particularly limited, which may include, for example, at least one of silicon oxide ($SiO_x$), silicon nitride ($SiN_x$), and silicon dioxide ($SiO_2$). According to an embodiment of the present disclosure, the active layer 400 may be formed of low temperature polysilicon.

According to an exemplary embodiment, as shown in FIG. 1, the orthographic projection of the active layer 400 on the substrate 100 has area larger than that of the orthographic projection of the first electrode 200 on the substrate 100. In other words, when the first electrode 200 also serves as a light shielding layer, only a portion of the active layer is "shielded". Thus, the use performance of the low temperature polysilicon thin film transistor can be further improved.

Figure 3:
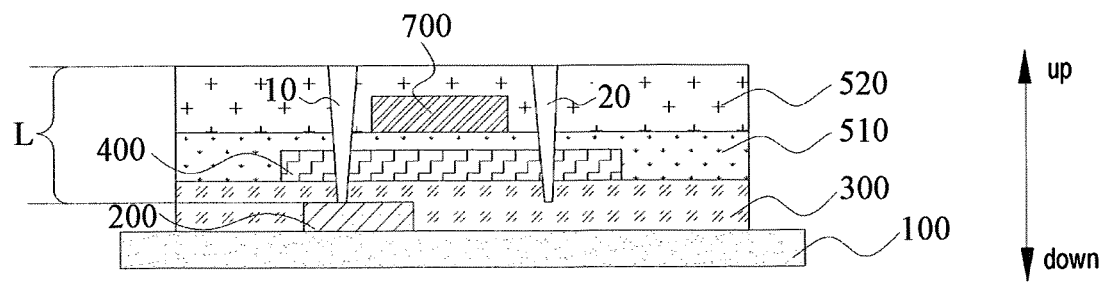
FIG. 3 illustrates a partial structural schematic view of a thin film transistor according to a further exemplary embodiment.
Figure 4:
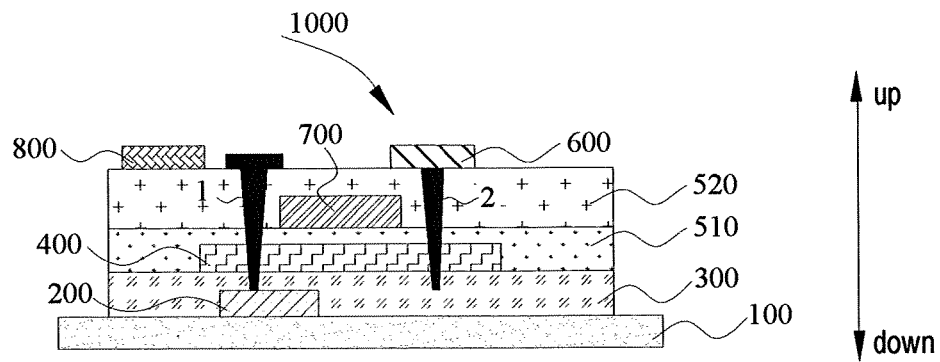
FIG. 4 illustrates a schematic structural view of a thin film transistor according to an exemplary embodiment.

According to an exemplary embodiment, as described above, in the thin film transistor 1000, the first electrode 200 may be connected to the active layer 400 through the first via 1 and the second electrode 600 may be connected to the active layer 400 through the second via 2. It can be understood by those skilled in the art that the first via 1 and the second via 2 are filled with a conductive material, so that the first electrode 200 and the second electrode 600 can be connected to the active layer 400 through the conductive material filled in the vias. The way of filling the conductive material and the type thereof are not limited herein as long as the first via 1 and the second via 2 can realize connections of the first electrode 200 and the second electrode 600 to the active layer 400. According to a specific embodiment, as shown in FIG. 3, the first via 10 and the second via 20 may be formed synchronously, that is, the first via 10 and the second via 20 may be formed by a single etching process. Specifically, after the first electrode 200 is formed, the buffer layer 300, the active layer 400, the gate insulating layer 510, the gate 700, and the interlayer insulating layer 520 may continue to be formed instead of etching the first via. Subsequently, the first via 10 and the second via 20 are formed by etching before the second electrode 600 is formed. According to an exemplary embodiment, as shown in FIG. 3, the depths of the first via 10 and the second via 20 may be equal, that is, in case the first via 10 and the second via 20 are formed by a single etching process, the formed first via 10 and the second via 20 have the same depths under the same process condition parameters. Specifically, the first via 10 and the second via 20 may both have a depth (depth L shown in FIG. 3) penetrating through the interlayer insulating layer 520, the gate insulating layer 510, and the active layer 400, and extending to a surface of the first electrode 200 away from the substrate 100. Subsequently, a conductive material is filled in the first via 10 and the second via 20 by deposition and patterning processes, and a second electrode layer 600 is formed on a side of the interlayer insulating layer 520 away from the gate 700, as shown in FIG. 4. In particular, the conductive material filled in the first via 10 and the second via 20 and the second electrode layer 600 may be formed simultaneously using a metal material to simplify the manufacturing process and reduce the manufacturing cost. It is to be noted that, in the case where the first via and the second via having the same depths are simultaneously formed, the orthographic projection of the first electrode 200 on the substrate 100 does not overlap the orthographic projection of the second electrode 600 on the substrate 100, as shown in FIG. 7, so as to ensure electrical isolation between the first electrode 200 and the second electrode 600. Moreover, the orthographic projection of the first via 10 on the substrate 100, and the orthographic projection of the second via 20 on the substrate 100 do not overlap the orthographic projection of the gate 700 on the substrate 100, as shown in FIG. 7, so as to ensure normal operation of the thin film transistor.

In the above embodiment, since the first via and the second via both penetrate through the active layer, the first via and the second via enable the first electrode and the second electrode to connect the active layer, respectively. Thus, on the one hand, the first electrode 200 and the second electrode 600 may be electrically connected to the active layer 400 through the first via 10 and the second via 20, respectively; on the other hand, although the first electrode 200 and the second electrode 600 (i.e., the source and the drain) in the thin film transistor 1000 are not disposed in the same layer, the first via 10 and the second via 20 can still be formed at one time, thereby achieving electrical connections between the source and the drain, and the active layer. Therefore, this solution can improve the use performance of the formed thin film transistor, reduce occurrence of display defects such as squares, bright spots, and the like, and reduce the production cost without significantly adjusting the conventional manufacturing process.

According to an exemplary embodiment, as shown in FIGS. 2 and 4, the thin film transistor 1000 may further comprise a data line 800 in which the data line 800 is disposed in the same layer as the second electrode 600, that is, the data line 800 and the second electrode 600 may be simultaneously formed using the same material in a single patterning process. As a result, the use performance of the thin film transistor 1000 is further improved. In an exemplary embodiment, the data line 800 may be disposed in the same layer as the second electrode 600 regardless of whether the first via and the second via are formed synchronously and whether their depths are equal. According to an exemplary embodiment, the data line 800 is configured to connect the thin film transistor to an external driving circuit. By way of example, the data line 800 may be a touch electrode data line and connected to a touch electrode. Since the source and the drain in the thin film transistor according to an exemplary embodiment are disposed in different layers, the layer in which the second electrode layer 600 is located has more void space because of not including the first electrode 200. In the above embodiment, the data line 800 is disposed in the same layer as the second electrode 600 to make full use of the space of this layer. Further, since this layer only includes the second electrode 600, the data line 800, and a connection line connected to the second electrode 600, it is possible to reserve only one connection point at the top of the first via 10 as long as it can realize an electrical connection between the first electrode 200 and the active layer 400. Therefore, this solution can mitigate defects resulting from more etching residues caused by close distances between the electrodes and the connection lines.

In another exemplary embodiment, there is provided an array substrate comprising the thin film transistor described above. Therefore, the array substrate has all the features and advantages of the thin film transistor described above, and details are not described herein again. In general, the array substrate has a high process yield, good use performance, and a low production cost.

In a further aspect of the present disclosure, a method of manufacturing a thin film transistor is provided. According to an exemplary embodiment, the thin film transistor manufactured by the method may be the thin film transistor described above. Therefore, the thin film transistor manufactured by the method has all the features and advantages of the thin film transistor described above, and details are not described herein again.

Figure 5:
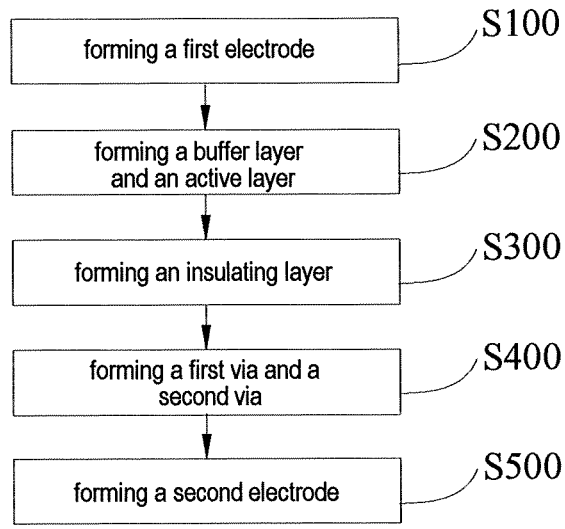
FIG. 5 illustrates a flow chart of a method of manufacturing a thin film transistor according to an exemplary embodiment.

According to an exemplary embodiment, as shown in FIG. 5, the manufacturing method comprises, at step S100, forming a first electrode; at step S200, forming an optional buffer layer and an active layer on the first electrode; at optional step S300, forming an insulating layer on the active layer; at optional step S400, forming a first via and a second via; and at step S500, forming a second electrode on the insulating layer.

Specifically, in step S100, a first electrode is formed on the substrate. According to an exemplary embodiment, the specific type of the substrate is not particularly limited, and it may be an insulating substrate such as glass or the like. According to an exemplary embodiment, the material for forming the first electrode and the structure thereof are not particularly limited, which may be, for example, a metal material including at least one of Al, Cu, Mo, Ti or AlNd. For example, the first electrode may be a single-layer metal film of Al, Cu, Mo, Ti, AlNd, or the like, or may be a multilayer metal film such as Mo/Al/Mo, Ti/Al/Ti, or the like. According to an exemplary embodiment, a metal electrode film may be formed on the substrate by ion sputtering, and a patterning process is performed (including coating a photoresist on the metal electrode film to form a patterned photoresist pattern, etching the metal electrode film by a drying etching process, and stripping off the photoresist to thereby form a patterned metal electrode film, i.e., the first electrode, on the substrate) to form a first electrode. In the case of a low temperature polysilicon thin film transistor, the first electrode can be used not only as a source or a drain of the formed low temperature polysilicon thin film transistor but also as a light shielding layer to suppress generation of a leakage current. Thus, there is no need to further add to the method a step of separately fabricating a light shielding layer, and the resulting thin film transistor still has the function of the light shielding layer. Further, the formed thin film transistor has better use performance and product yield due to reduction of defects such as bright spots, and has a reduced production cost due to omission of the light shielding layer. In addition, the wiring in the same layer as and connected to the first electrode may also be fabricated synchronously in this step.

In step S200, a buffer layer and an active layer are sequentially formed on a side of the first electrode formed in the previous step away from the substrate. According to an exemplary embodiment, a buffer layer and a semiconductor layer may be formed by vapor deposition (e.g., plasma enhanced chemical vapor deposition) at one time, and then the semiconductor layer is patterned by a patterning process to form an active layer. According to an exemplary embodiment, the material for forming the buffer layer is not particularly limited, which may include, for example, at least one of silicon oxide ($SiO_x$), silicon nitride ($SiN_x$), and silicon dioxide ($SiO_2$). According to an embodiment of the present disclosure, the low temperature polysilicon active layer may be formed by firstly depositing an amorphous silicon layer, and then crystallizing the amorphous silicon layer into polysilicon by a low temperature crystallization (e.g., excimer crystallization) process.

According to an exemplary embodiment, the orthographic projection of the active layer formed in this step on the substrate at least partially overlaps the orthographic projection of the first electrode on the substrate. By way of example, the orthographic projection of the formed active layer on the substrate has area larger than that of the orthographic projection of the first electrode on the substrate. As a result, the use performance of the formed thin film transistor is further improved.

Figure 6:
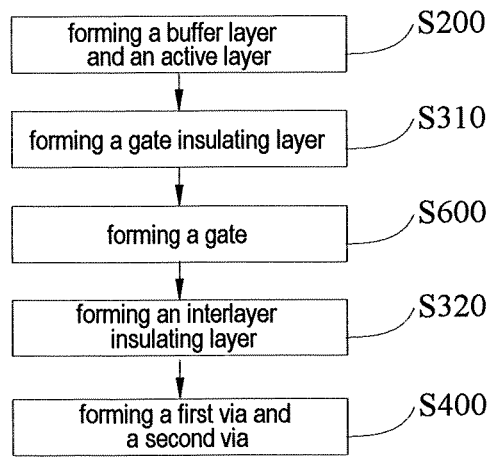
FIG. 6 illustrates a flow chart of part of a method of manufacturing a thin film transistor according to another exemplary embodiment.

According to an exemplary embodiment, as shown in FIG. 6, after forming the buffer layer and the active layer and before forming the first via and the second via, the method further comprises: at step S310, forming a gate insulating layer on the active layer; at step S600, forming a gate on the gate insulating layer; and at step S320, forming an interlayer insulating layer on the gate.

Specifically, in step S310, a gate insulating layer is formed on a side of the active layer formed in the previous step away from the buffer layer. According to an exemplary embodiment, the material for forming the gate insulating layer is not particularly limited, which may include, for example, at least one of silicon oxide ($SiO_x$), silicon nitride ($SiN_x$), and silicon dioxide ($SiO_2$). According to an embodiment of the present disclosure, the gate insulating layer may be formed by a vapor deposition method.

In step S600, a gate is formed on a side of the gate insulating layer formed in the previous step away from the active layer. According to an exemplary embodiment, the material for forming the gate and the structure thereof are not particularly limited, which may be, for example, a metal material including at least one of Al, Cu, Mo, Ti or AlNd. By way of example, the gate may be a single-layer metal film of Al, Cu, Mo, Ti, AlNd, or the like, or may be a multilayer metal film such as Mo/Al/Mo, Ti/Al/Ti, or the like. According to an exemplary embodiment, a metal electrode film may be formed by ion sputtering on a side of the gate insulating layer away from the active layer, and a gate is then formed by a patterning process.

In step S320, an interlayer insulating layer is formed on a side of the gate formed in the previous step away from the gate insulating layer. According to an exemplary embodiment, the material for forming the interlayer insulating layer is not particularly limited, which may include, for example, at least one of silicon oxide ($SiO_x$), silicon nitride ($SiN_x$), and silicon dioxide ($SiO_2$). According to an exemplary embodiment, the interlayer insulating layer may be formed by a vapor deposition method.

In step S400, after the interlayer insulating layer is formed, the first via and the second via are formed by a patterning process. According to an exemplary embodiment, the formed first via is in contact with the first electrode so that two ends of the formed first via are connected to the first electrode and the active layer, respectively. According to an exemplary embodiment, the formed second via extends to the active layer, that is, the formed second via may connect the second electrode and the active layer.

According to a specific embodiment of the present disclosure, the first via and the second via may be formed synchronously, and the formed first via and the second via may have equal depths, thus the first via and the second via can be easily formed. Specifically, the first via and the second via may both have a depth penetrating through the interlayer insulating layer, the gate insulating layer, and the active layer formed in the previous steps, and extending to a surface of the first electrode away from the substrate. The specific structures, depths, and the like of the first via and the second via have been described in detail above and will not be described herein again.

In step S500, a second electrode is formed on a side of the interlayer insulating layer with a via formed in the previous step away from the gate. According to an exemplary embodiment, the material for forming the second electrode and the structure thereof are not particularly limited, which may be, for example, a metal material including at least one of Al, Cu, Mo, Ti or AlNd. By way of example, the second electrode may be a single-layer metal film of Al, Cu, Mo, Ti, AlNd or the like, or may be a multilayer metal film such as Mo/Al/Mo, Ti/Al/Ti or the like. According to an exemplary embodiment, a metal electrode film may be formed by ion sputtering on a side of the interlayer insulating layer away from the gate, and a second electrode is then formed by a patterning process. In this step, while depositing the metal material, the metal may be filled into the first via and the second via formed previously, thereby achieving connections of the first electrode and the second electrode to the active layer.

According to an exemplary embodiment, in this step, the second electrode and a data line of the array substrate where the thin film transistor is located may also be formed simultaneously by a patterning process. As a result, the use performance of the formed thin film transistor is further improved. According to an exemplary embodiment, the data line can be used to connect the thin film transistor to an external device. For example, the data line 800 may be a touch electrode data line (TMP Line), which can be used for connection with a touch electrode, etc.

In summary, the first electrode and the second electrode (i.e., the source and the drain) of the thin film transistor manufactured by the method are layered, which can reduce the etching residues generated when the first electrode and the second electrode are formed, and further reduce or even avoid occurrence of display defects such as squares, bright spots, and the like. In the case of a low temperature polysilicon thin film transistor, the first electrode can also serve as a light shielding layer, which can reduce the production cost. Therefore, the method has a high process yield, a low production cost, and a simple manufacturing process.

In yet another exemplary embodiment, there is provided a display device comprising any of the array substrates described above. Therefore, the display device has all the features and advantages of the array substrate described above and the thin film transistor manufactured by the method described above, and details are not described herein again. In general, the display device has good display performance and a low production cost.

In the description of the exemplary embodiments herein, the orientations or positional relationships indicated by the terms "upper", "lower" and the like are based on the orientations or positional relationships shown in the drawings, which are merely intended to facilitate description of the present disclosure rather than require that the present disclosure must be constructed and operated in specific orientations, and thus cannot be construed as limiting the present disclosure.

It is to be noted that, in the above description of the method, the steps of the method are described in a certain order. However, it does not mean the method must be performed in this order, but the steps of the method may be performed in any order or concurrently as needed.

In the description of the specification, the description of the term "one embodiment", "another embodiment" "an exemplary embodiment" or the like means that the specific features, structures, materials or characteristics described in conjunction with the embodiment are included in at least one embodiment of the present disclosure. In the specification, the schematic representation of the above term is not necessarily directed to the same embodiment or example. Furthermore, the specific features, structures, materials or characteristics described may be combined in a suitable manner in any one or more embodiments or examples. In addition, different embodiments or examples described in the specification, as well as features of different embodiments or examples, may be combined by those skilled in the art in the case of causing no conflict.

While exemplary embodiments have been shown and described above, it can be understood that the foregoing embodiments are illustrative and are not to be construed as limiting the present disclosure. A person having an ordinary skill in the art can make variations, amendments, substitutions and modifications to the above embodiments within the scope of the present disclosure.

The invention claimed is:

1. A thin film transistor comprising:
a substrate, and
a buffer layer, an active layer and an insulating layer stacked on the substrate in sequence,
wherein the thin film transistor further comprises a source, a drain, a first via and a second via,
wherein the source is located between the active layer and the substrate, and the source is covered by the buffer layer, the drain is located on a surface of the insulating layer facing away from the substrate, so that the source and the drain are respectively located at two sides of the active layer directly opposite to each other,
wherein the first via is in the buffer layer and extends only between a surface of the source facing away from the substrate and a first surface of the active layer facing the substrate, and the second via is in the insulating layer and extends only between a second surface of the active layer facing away from the substrate and a surface of the drain facing the substrate, such that both the first via and the second via do not penetrate through the active layer, wherein the first surface of the active layer is directly opposite to the second surface of the active layer, and wherein the source comprises a light shielding material.

2. The thin film transistor according to claim 1, wherein the active layer comprises a low temperature polysilicon material, and an orthographic projection of the source on the substrate at least partially overlaps an orthographic projection of the active layer on the substrate.

3. The thin film transistor according to claim 2, wherein the orthographic projection of the active layer on the substrate has an area larger than an area of the orthographic projection of the source on the substrate.

4. The thin film transistor according to claim 1, wherein the insulating layer comprises a gate insulating layer on a side of the active layer away from the buffer layer, and an interlayer insulating layer on a side of the gate insulating layer away from the active layer, the thin film transistor further comprises a gate between the interlayer insulating layer and the gate insulating layer.

5. The thin film transistor according to claim 1, wherein both the first via and the second via comprise a conductive material, wherein the drain is in unity with the conductive material filling the second via.

6. The thin film transistor according to claim 4, wherein an orthographic projection of the source on the substrate does not overlap an orthographic projection of the drain on the substrate, and
wherein an orthographic projection of the first via on the substrate, and an orthographic projection of the second via on the substrate do not overlap an orthographic projection of the gate on the substrate.

7. A method of manufacturing the thin film transistor according to claim 1, comprising:
forming the source on the substrate;
forming the active layer on a side of the source away from the substrate; and
forming the drain on the side of the active layer away from the source.

8. The method according to claim 7, further comprising:
forming the buffer layer covering the source on the substrate;
forming the first via in the buffer layer, the insulating layer and the active layer, the first via communicating the active layer with the source;
forming the insulating layer between the active layer and the drain; and
forming the second via in the insulating layer and the active layer, the second via communicating the drain and the active layer.

9. The method according to claim 7, wherein the active layer is fabricated using a low temperature polysilicon material, the source is fabricated using a light shielding material, and an orthographic projection of the source on the substrate at least partially overlaps an orthographic projection of the active layer on the substrate.

10. The method according to claim 8, wherein the drain and a conductive material filling the second via are simultaneously formed in a single patterning process.

11. The method according to claim 8, wherein forming the insulating layer comprises forming a gate insulating layer on a side of the active layer away from the buffer layer, and forming an interlayer insulating layer on a side of the gate insulating layer away from the active layer, and the method further comprises:

forming a gate between the interlayer insulating layer and the gate insulating layer.

12. The method according to claim 11, wherein an orthographic projection of the source on the substrate does not overlap an orthographic projection of the drain on the substrate, and wherein an orthographic projection of the first via on the substrate, and an orthographic projection of the second via on the substrate do not overlap an orthographic projection of the gate on the substrate.

13. The method according to claim 12, wherein the drain and a conductive material filling the first via and the second via are simultaneously formed in a single patterning process.

14. An array substrate comprising the thin film transistor according to claim 1.

15. The array substrate according to claim 14, further comprising a data line in a same layer as the drain.

16. The array substrate according to claim 14, wherein the active layer comprises a low temperature polysilicon material, and an orthographic projection of the source on the substrate at least partially overlaps an orthographic projection of the active layer on the substrate.

17. The array substrate according to claim 16, wherein the orthographic projection of the active layer on the substrate has an area larger than an area of the orthographic projection of the source on the substrate.

18. A display device comprising the array substrate according to claim 14.

* * * * *